(12) United States Patent
McGowan et al.

(10) Patent No.: US 7,206,355 B2
(45) Date of Patent: Apr. 17, 2007

(54) DIGITALLY CONVERTIBLE RADIO

(75) Inventors: Neil N. McGowan, Stittsville (CA); Marthinus W. Da Silveira, Nepean (CA); Mihai Parvan, Gloucester (CA); Matthew Conrod, Ottawa (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 718 days.

(21) Appl. No.: 10/307,624

(22) Filed: Dec. 2, 2002

(65) Prior Publication Data

US 2004/0105509 A1 Jun. 3, 2004

(51) Int. Cl.
*H04L 27/00* (2006.01)
(52) U.S. Cl. ..................................... 375/295
(58) Field of Classification Search ............... 455/501, 455/63.1, 114.2, 114.3; 375/296, 297; 332/107, 332/123, 159, 162
See application file for complete search history.

(56) References Cited

U.S. PATENT DOCUMENTS

| | | |
|---|---|---|
| 5,675,285 A | 10/1997 | Winters |
| 6,006,111 A | 12/1999 | Rowland |
| 6,591,090 B1 * | 7/2003 | Vuorio et al. ............. 455/126 |
| 2001/0051504 A1 * | 12/2001 | Kubo et al. .................. 455/63 |
| 2002/0016154 A1 * | 2/2002 | Huttunen ..................... 455/63 |
| 2004/0001559 A1 * | 1/2004 | Pinckley et al. ............ 375/297 |
| 2004/0097214 A1 * | 5/2004 | Gard et al. .................. 455/323 |
| 2004/0105509 A1 * | 6/2004 | McGowan et al. ......... 375/296 |
| 2004/0203478 A1 * | 10/2004 | Scott ........................... 455/70 |

FOREIGN PATENT DOCUMENTS

EP 0 877 444 A 11/1998

* cited by examiner

*Primary Examiner*—Khai Tran
*Assistant Examiner*—Aslan Ettehadieh
(74) *Attorney, Agent, or Firm*—Garlick Harrison & Markison; James A. Harrison

(57) ABSTRACT

A forward link transmitter in a sectored cell includes a baseband processor having traditional baseband signal digital processing circuitry in addition to including a digital hybrid matrix (vector and delay compensated transformation module) whose phase and amplitude (vector) and delay may be adjusted to compensate for downstream errors that are introduced and detected by a feedback circuit. Accordingly, the baseband processor, by monitoring an output of an analog hybrid matrix producing modulated and amplified radio frequency (RF) signals just prior to propagation from an antenna, can determine errors produced by the analog circuitry including the analog hybrid matrix and may compensate for the same by introducing an amplitude, phase and delay adjustment (in the digital domain) into output digital waveform signals to compensate for the error introduced downstream to the baseband processor.

7 Claims, 5 Drawing Sheets

Radio Transmitter

Prior Art Cellular Network Cell

Prior Art Analog Hybrid Matrix

Radio Transmitter

Radio Transmitter with Feedback Loop

DIGITALLY CONVERTIBLE RADIO

TECHNICAL FIELD OF THE INVENTION

This invention relates generally to wireless communication systems and, more particularly, to radio frequency (RF) transmitters used within radio transceivers of such wireless communication systems.

DESCRIPTION OF RELATED ART

Communication systems are known to support wireless and wire line communications between wireless and/or wire line communication devices. Such communication systems range from national and/or international cellular telephone systems to the Internet, to point-to-point in-home wireless networks. Each type of communication system is constructed, and hence operates, in accordance with one or more communication standards. For instance, wireless communication systems may operate in accordance with one or more standards, including, but not limited to, advanced mobile phone services (AMPS), digital AMPS, global system for mobile communications (GSM), code division multiple access (CDMA), universal mobile telephone systems (UMTSs), local multi-point distribution systems (LMDSs), multi-channel-multi-point distribution systems (MMDSs), and/or variations thereof, including wireless LAN networks such as IEEE 802.11, Bluetooth, etc.

For direct communications (also known as point-to-point communications), the participating wireless communication devices tune their receivers and transmitters to the same channel or channels (e.g., one of a plurality of radio frequency carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

As is known by those of average skill in the art, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

Typically, in a sectored cellular network wherein each cell is divided into three or more cell sectors, each having its own amplification and transmission circuitry, beam forming antennas typically are used to create a forward link transmission pattern that fills the cell sector without overlapping in adjacent cell sectors. While one or two amplifiers could be used in a cell having more than two sectors, it is common to use one amplifier per cell sector. One problem that has been addressed by the prior art is that of amplifier failure in one of the sectors. A pair of N×N hybrid matrices are used in prior art. The first matrix will divide a signal at an input port of the first N×N hybrid matrix into N equal components, with a taper applied to each of the components. The N signals are then applied to N high power amplifiers, whereafter the amplified signals are fed to a second N×N hybrid matrix such that the original signal will only appear at one of the second N×N hybrid matrix output ports. One benefit of using the N×N hybrid matrix for this is that each signal is amplified partially by each of the amplifiers that are operational. Thus, if one amplifier were to fail, all output signals could be amplified sufficiently for transmission through all of the cell sectors (though in a degraded mode of operation). In the hybrid matrix amplifier (prior art), the hybrid matrix is fixed so that the degraded mode of operation impacts the signal-to-noise ratio. Such power sharing further has an advantage in that each forward link amplifier need not be designed to accommodate maximum power loads because additional power may be obtained from one or more other power amplifiers for maximum power requirements (across all the sectors). Thus, lower cost power amplifiers may be utilized.

FIG. 1 is a functional block diagram of a prior art cellular network cell having three cell sectors. More specifically, a cell 02 includes three cell sectors 04. Approximately in the center of cell 02 exists a base station transceiver set (BTS) 06 that includes an amplifier 08 and an antenna 10 for each cell sector 04. FIG. 1 shows the amplifiers 08 and antennas 10 well within its corresponding cell sector 04 to show the relationships therefor. It is understood, however, that the amplifiers 08 and antennas 10 for the cell sectors 04 are located approximately in the center of cell 02. The antennas 10 are so called sector antennas that radiate a pattern to fill cell sectors 04 without overlapping into an adjacent cell sector. For a system as shown in FIG. 1 in which distinct amplifiers are used but in which a hybrid matrix is not included for power sharing, each of the amplifiers 08 must be designed to satisfy maximum power level demands for the sector.

FIG. 2 is a prior art transmitter that includes a pair of analog hybrid matrices. A baseband radio 14 produces a plurality of digital waveform signals to a digital-to-analog conversion module 16 to generate a corresponding plurality of analog signals. The plurality of analog signals are then up-converted by a plurality of mixers 18 that up-convert the plurality of analog signals by multiplying the baseband signals with a local oscillation signal to create output RF signals. The output RF signals are then produced to a first hybrid matrix 20 that produces a corresponding number of transformed signals. More specifically, if the first hybrid matrix 20 receives signals sig_1, sig_2 and sig_3, it produces three transformed analog signals having components of all three signals sig_1, sig_2 and sig_3.

A power amplifier module 22 includes a plurality of power amplifiers that are coupled to receive the $1^{st}$, $2^{nd}$, and $3^{rd}$ transformed analog output signals from the first hybrid matrix 20 and amplifies them. A second hybrid matrix 24 then receives the $1^{st}$, $2^{nd}$, and $3^{rd}$ transformed and amplified signals and recombines them to create amplified versions of sig_1, sig_2, and sig_3 at the second hybrid matrix 24 outputs. In operation, the second hybrid matrix 24 adds the signals at the sum port and cancels out signal portions at the output ports of the second hybrid matrix 24. To effectively cancel unwanted signal components at the output ports, however, the relative component vector (phase and amplitude) and delay must be as expected. If a vector and/or delay error is introduced in or between the first hybrid matrix 20 or the second hybrid matrix 24, then perfect cancellation does not occur at the undesired ports and a resulting waveform continues to include components of other waveforms. Accordingly, it is desirable to eliminate the effects of introduced relative vector and delay errors.

While utilizing hybrid matrices are advantageous for the described reasons, including power sharing, hybrid matrices are analog devices that introduce vector and delay errors in the output RF signal. Accordingly, what is needed is a system that allows for power sharing to achieve the benefits of an analog hybrid matrix amplifier pair but that produces output signals with the ability to compensate for vector and delay errors.

BRIEF SUMMARY OF THE INVENTION

A base station transmitter in a sectored cell includes a baseband processor having traditional baseband digital signal processing circuitry for transmitting forward link communication signals. In addition, the base station transmitter includes a digital signal processor that includes modules that form a digital hybrid matrix having logic for vector and delay adjustments to compensate for downstream vector and delay errors that are introduced. Accordingly, the baseband processor, by monitoring an output of an analog hybrid matrix producing modulated and amplified radio frequency (RF) signals just prior to propagation from an antenna, can indirectly determine relative vector and delay errors produced by the analog hybrid matrix, amplifiers, mixers, up-converters and connection circuitry coupled downstream from the digital signal processing circuitry and may compensate for the same by introducing a vector and delay adjustment (in the digital domain) into output digital waveform signals to compensate for the errors introduced downstream to the baseband processor. Thus, an output signal of the analog hybrid matrix after compensation has far less, or perhaps even no, vector (phase and amplitude) or delay errors despite the addition of these errors from the downstream circuitry mentioned above.

More specifically, the baseband processor includes a first processing module for generating a plurality of digital waveform signals, wherein the plurality of digital waveform signals represents a corresponding plurality of RF analog signals that are to be transmitted within corresponding cell sectors of a cellular network cell. A second processing module receives the plurality of digital waveform signals to produce a plurality of transformed digital waveform signals each containing a portion of each of the plurality of digital waveform signals. The second processing module includes a vector and delay detection module and a vector and delay compensated transformation module. The second processing module includes a vector and delay compensated transformation module that transforms and modifies the received digital waveform signals in phase, amplitude and delay and produces its output to a third processing module. The output of the second processing module is a plurality of transformed digital waveform signals that compensate for downstream vector and delay errors. The third processing module is coupled to receive the outputs of the second processing module and includes a baseband pre-distortion (BBPD) module, that adjusts for amplifier distortion and a peak power reduction (PPR) module that reduces peak power for a given digital waveform signal thereby reducing the peak power demand of the power amplifier without significant signal degradation. The third processing module produces a plurality of transformed and adjusted digital waveform signals.

The plurality of transformed and adjusted digital waveform signals output from the third processing module is then produced to a digital-to-analog conversion module for converting to an analog (analog signal) domain. A plurality of transformed analog signals produced by the digital-to-analog conversion module is then produced to an up-conversion module for mixing a local oscillation signal and are up-converted from a baseband frequency, or intermediate frequency (IF) if an IF stage is used, to a radio frequency to produce a plurality of transformed RF analog signals. At least one power amplifier module is coupled to receive the plurality of transformed and amplified RF analog signals to produce a plurality of amplified RF analog signals wherein each of the plurality of amplified RF analog signals corresponds to each of the plurality of digital waveform signals.

A hybrid matrix module, which, in the described embodiment of the invention is an analog hybrid matrix, is coupled to receive the plurality of transformed and amplified RF analog signals to create a plurality of amplified RF analog signals that are to be transmitted within corresponding cell sectors of a cellular network cell. Finally, the inventive transmitter includes feedback circuitry coupled to receive the plurality of RF analog signals and produces a digital representation of the plurality of amplified RF analog signals to the second processing module of the baseband processor module (by way of a digital-to-analog converter). Accordingly, the second processing module is able to indirectly determine relative vector and delay errors produced by the analog hybrid matrix, amplifiers, mixers, up-converters and connection circuitry coupled downstream from the digital signal processing circuitry and may compensate for the same by introducing a vector and delay adjustment (in the digital domain) into the plurality of transformed digital waveform signals to compensate for the errors introduced downstream to the baseband processor. The second processing module also includes a digital power amplifier failure compensation module for adjusting the signals in case of an amplifier failure such that power is steered to the required sectors with the best possible signal-to-noise ratio (best performance).

These and other features, aspects and advantages of the present invention will be more fully understood when considered with respect to the following detailed description, appended claims and accompanying drawings.

DETAILED DESCRIPTION OF THE INVENTION

Figure 1:
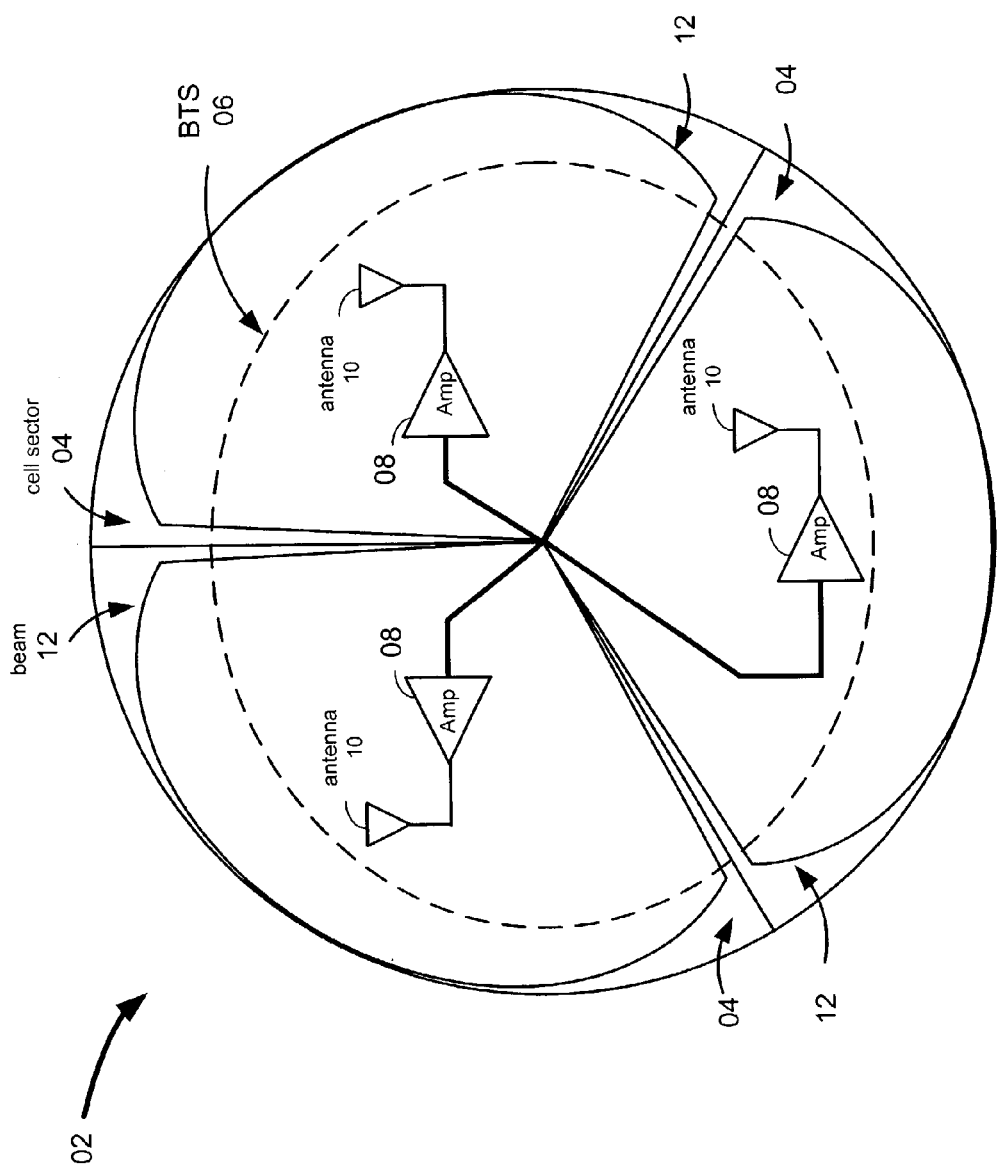
FIG. 1 is a functional block diagram of a prior art cellular network cell having three cell sectors.
Figure 2:
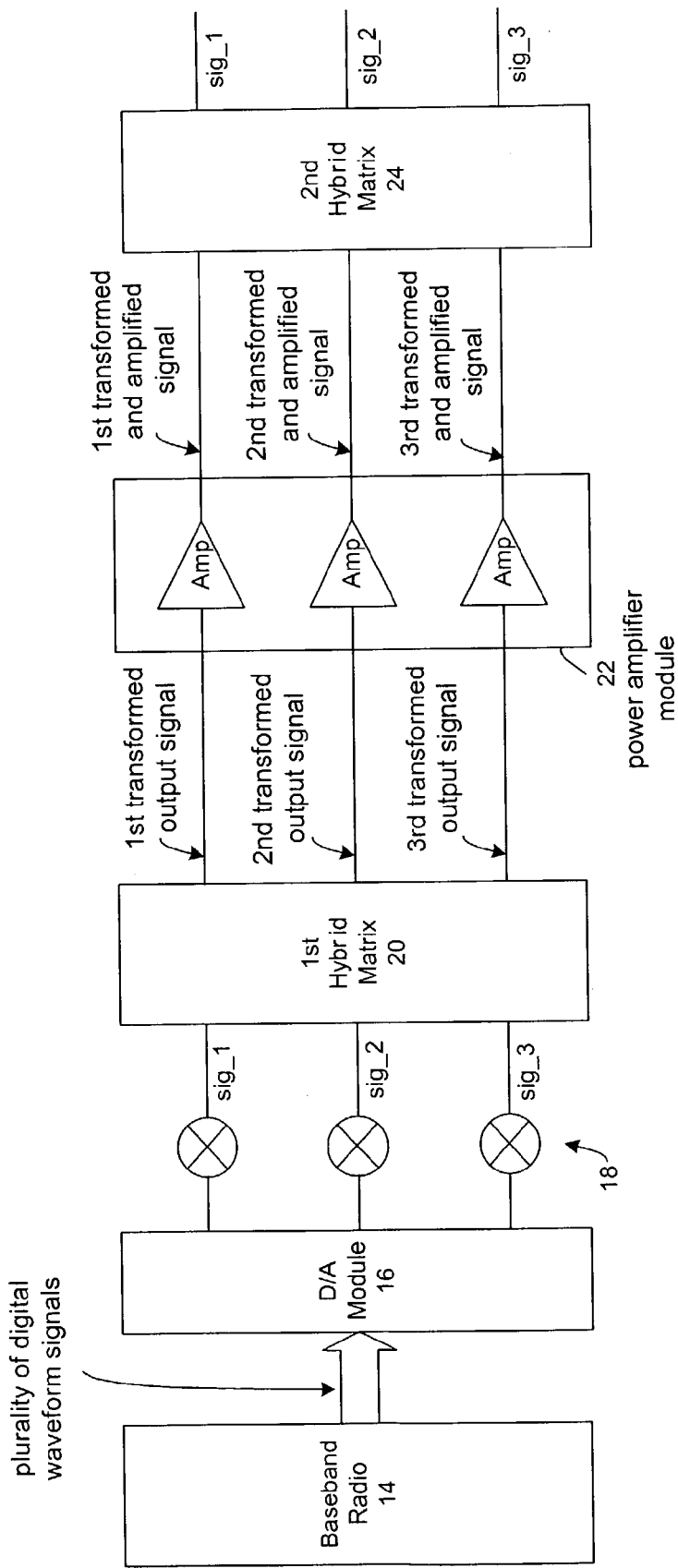
FIG. 2 is a prior art transmitter that includes a pair of analog hybrid matrices.
Figure 3:
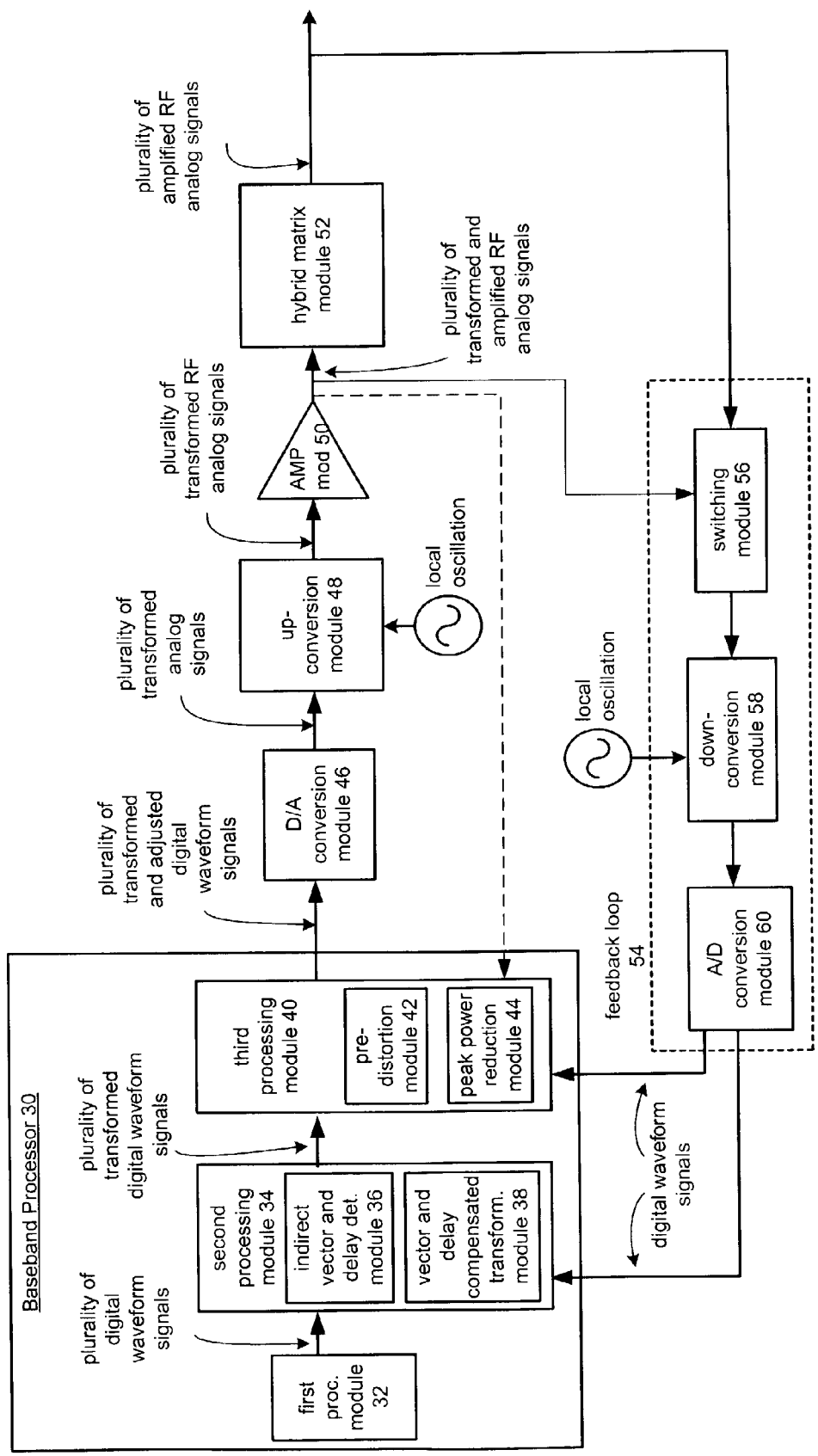
FIG. 3 is a functional block diagram of a radio transmitter formed according to one embodiment of the present invention.

FIG. 3 is a functional block diagram of a radio transmitter formed according to one embodiment of the present invention. A baseband processor 30 includes a plurality of modules that produce a plurality of transformed and adjusted digital waveform signals having compensation components that compensate for errors that are introduced downstream. More specifically, a first processing module 32 generates a plurality of digital waveform signals, each of which is a digital bit stream that represents an analog radio frequency (RF) signal (i.e., a digital representation of an "analog" RF signal) that is to be transmitted to a cell sector. A second processing module 34 receives the plurality of digital waveform signals and produces a plurality of transformed digital waveform signals wherein each of the plurality of transformed digital waveform signals include digital representations of portions of each of a plurality of RF analog signals represented by the plurality of digital waveform signals produced by the first processing module 32.

The second processing module 34 includes an indirect vector and delay detection module 36 and a vector and delay compensated transformation module 38. The indirect vector and delay detection module 36 uses the amplitude of the signals at the output ports to determine the degree of summation and cancellation. Based on the degree of summation and cancellation, the vector and delay compensated transformation module 38 is formed to introduce either one or both of a vector and delay component to the plurality of digital waveform signals by adjusting the vector and delay compensated transformation module 38. A plurality of transformed digital waveform signals produced by the second processing module 34 of the baseband processor 30 is thus modified in amplitude, phase and delay according to detected vector and delay errors introduced downstream. A third baseband processor 40 then applies a number of further processing functions to each of the plurality of transformed digital waveform signals at the output of the second processing module 34. The functions include baseband pre-distortion, peak power reduction and a number of filter functions. The baseband processor 30 and, more specifically, the third processing module 40, then produces the plurality of transformed and adjusted digital waveform signals to a digital-to-analog conversion module 46 wherein the plurality of transformed and adjusted digital waveform signals are converted from a digital domain to an analog domain to create a plurality of transformed analog signals. The converted plurality of transformed analog signals are then produced by the digital-to-analog conversion module 46 to an up-conversion module 48 where they are up-converted from a baseband frequency to a radio frequency (RF) to create a plurality of transformed RF analog signals.

The plurality of transformed RF analog signals is then produced from the up-conversion module 48 to a power amplification module 50 wherein the plurality of transformed RF analog signals is amplified to create a plurality of transformed and amplified RF analog signals. The plurality of transformed and amplified RF analog signals is then produced by the power amplification module 50 to a hybrid matrix module 52.

The hybrid matrix module 52 receives the plurality of transformed and amplified RF analog signals and produces a plurality of amplified RF analog signals to the appropriate sum and cancellation ports for transmission into an appropriate cell sector. Additionally, the plurality of amplified RF analog signals is also coupled to a feedback loop 54. The feedback loop 54 includes a switching module 56 coupled to receive and select between each of the plurality of transformed and amplified RF analog signals before the hybrid matrix module 52 and the plurality of amplified RF analog signals after the hybrid matrix module 52. The selected output of the switching module 56 is then produced to a down-conversion module 58 where it converts the selected amplified RF analog signal to a baseband or intermediate frequency. The down-converted signal is then produced to an analog-to-digital conversion module 60 that converts the signal to the digital domain. The digitally converted signals are produced by the analog-to-digital conversion module 60 to the third processing module 40, and more specifically, to a peak power reduction module 44 and to a pre-distortion module 42. Pre-distortion module 42 and peak power detection module 44 are operable to compensate for distortion and reduce peak power for a given digital waveform signal, respectively. The digitally converted signals are also produced to the indirect vector and delay detection module 36 of the second processing module 34.

The indirect vector and delay detection module 36 of the second processing module 34 then determines the degree of error of the sum and cancellation ports relative to desired values. The vector and delay compensated transformation module 38 of the second processing module 34 compensates and adjusts the amplitude, phase and delay of the corresponding components of the plurality of digital waveform signals produced by the first processing module 32, based on the errors determined by the indirect vector and delay detection module 36, by adjusting the vector and delay compensated transformation module 38 to compensate for the errors introduced downstream from the baseband processor 30.

For example, if the digital signal represents a first amplified RF analog signal, and the vector and delay compensated transformation module 38 determines that the first amplified RF analog signal from the hybrid matrix module 46 has a component that is lagging by 10 degrees due to introduced phase errors, then the vector and delay compensated transformation module 38 advances the corresponding component in the corresponding transformed and adjusted digital waveform signal by 10 degrees.

In this example, the phase shift of the component of the first amplified RF analog signal has been compensated by adding 10 degrees to the corresponding transformed and adjusted digital waveform signal. Similar compensation may also be made for the other signal components as necessary. For example, the indirect vector and delay detection module 36 is operable to detect vector (phase and amplitude) and delay errors and to compensate therefor.

Figure 4:
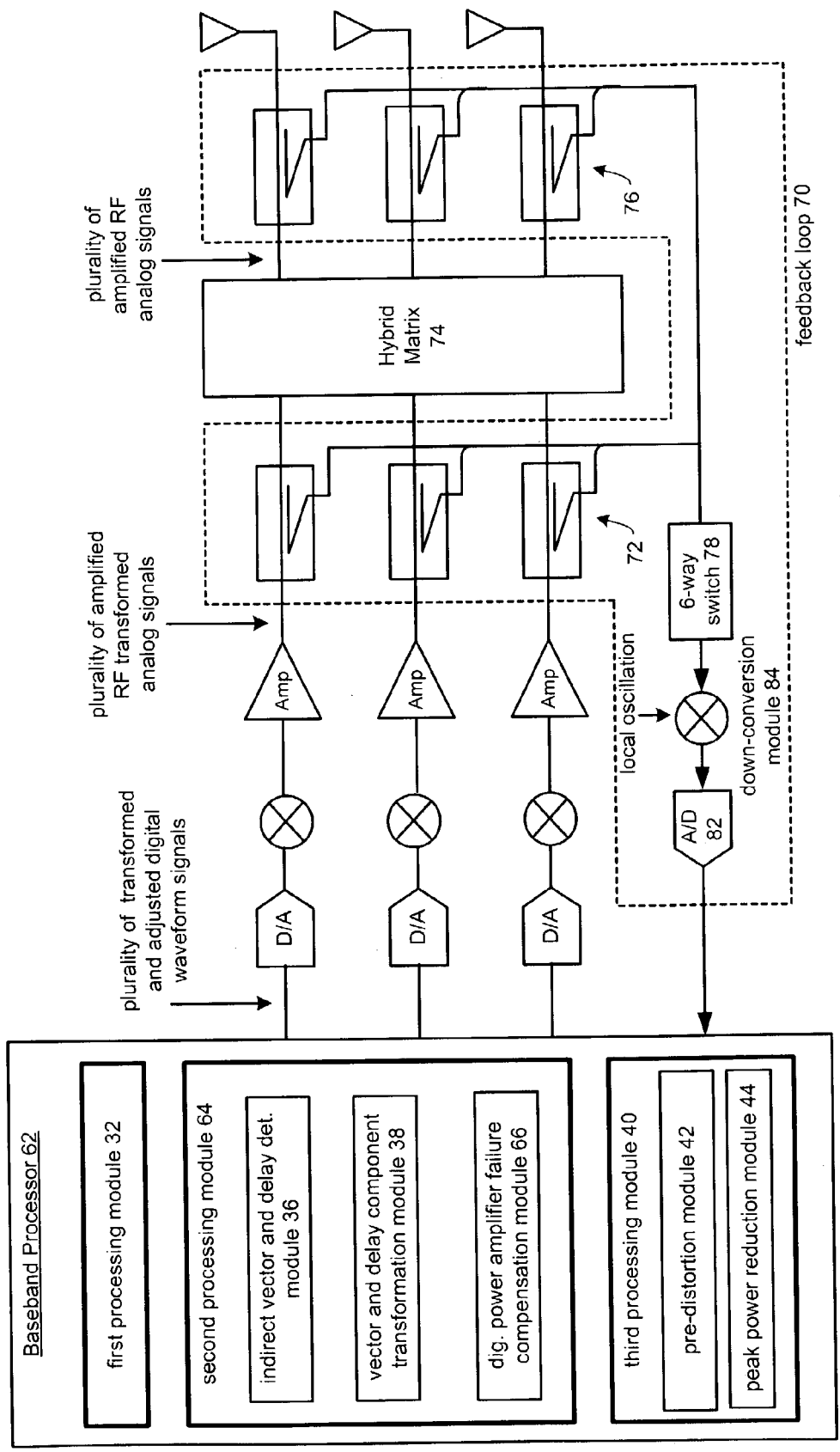
FIG. 4 is a functional block diagram of a radio transmitter illustrating one aspect of the present invention.

FIG. 4 is a functional block diagram of a radio transmitter illustrating one aspect of the present invention. A baseband processor 62 includes a first processing module 32, a second processing module 64 and a third processing module 40. First and third processing modules 32 and 40 are as described in FIG. 3. Second processing module 64, however, further includes a digital power amplifier failure compensation module 66.

The digital power amplifier failure compensation module 66 is, among other functions, for defining how the configuration of the vector and delay compensated transformation module 38 will change to compensate for a condition where one of the paths between the baseband processor 62 and a hybrid matrix 74 has failed, giving the best possible system performance under the given failure condition.

Statistically, all three sectors will not be fully loaded and since power is shared between all the amplifiers, the amplifier size can be reduced while still achieving the required total power across all sectors. Without power sharing, the amplifier power has to be high enough to handle the fully loaded sector. But, if the sector is under-loaded, the power of the amplifier power is under-utilized. Thus, power sharing allows the individual amplifier sizes to be reduced. The power sharing capability is a result of the transformation process.

Many of the components of FIG. 3 are shown in FIG. 4. Accordingly, those components will not be described further here in the description of FIG. 4. FIG. 4 further illustrates a feedback loop 70 that includes a plurality of directional couplers 72 that are connected between the power amplifiers for each branch and hybrid matrix 74, and a plurality of directional couplers 76 that are connected between hybrid matrix 74 and antennas through which RF is propagated. The feedback loop 70 further includes a six-way switch 78. In the example of FIG. 4, the six directional couplers 72 and 76 are coupled to the six-way switch 78 (or, alternatively, a multiplexer) that selects one of the six inputs provided by the six directional couplers 72 and 76 and produces the selected input to a down-conversion module 84.

The down-conversion module 84 then produces a baseband or intermediate frequency signal to an analog-to-digital converter 82 for converting the signal to the digital domain for processing and analysis by the baseband processor 62. The six directional couplers 72 and 76, the six-way switch 78, the down-conversion module 84 and the analog-to-digital converter 82 all are shown here in FIG. 4 as being part of the feedback loop 70. The feedback loop 70 produces the selected signal to the baseband processor 62 and, more particularly, to the second processing module 64 and third processing module 40 (and the modules included therein) for analysis as described herein and for phase, amplitude and delay of the corresponding signals responsive thereto.

Figure 5:
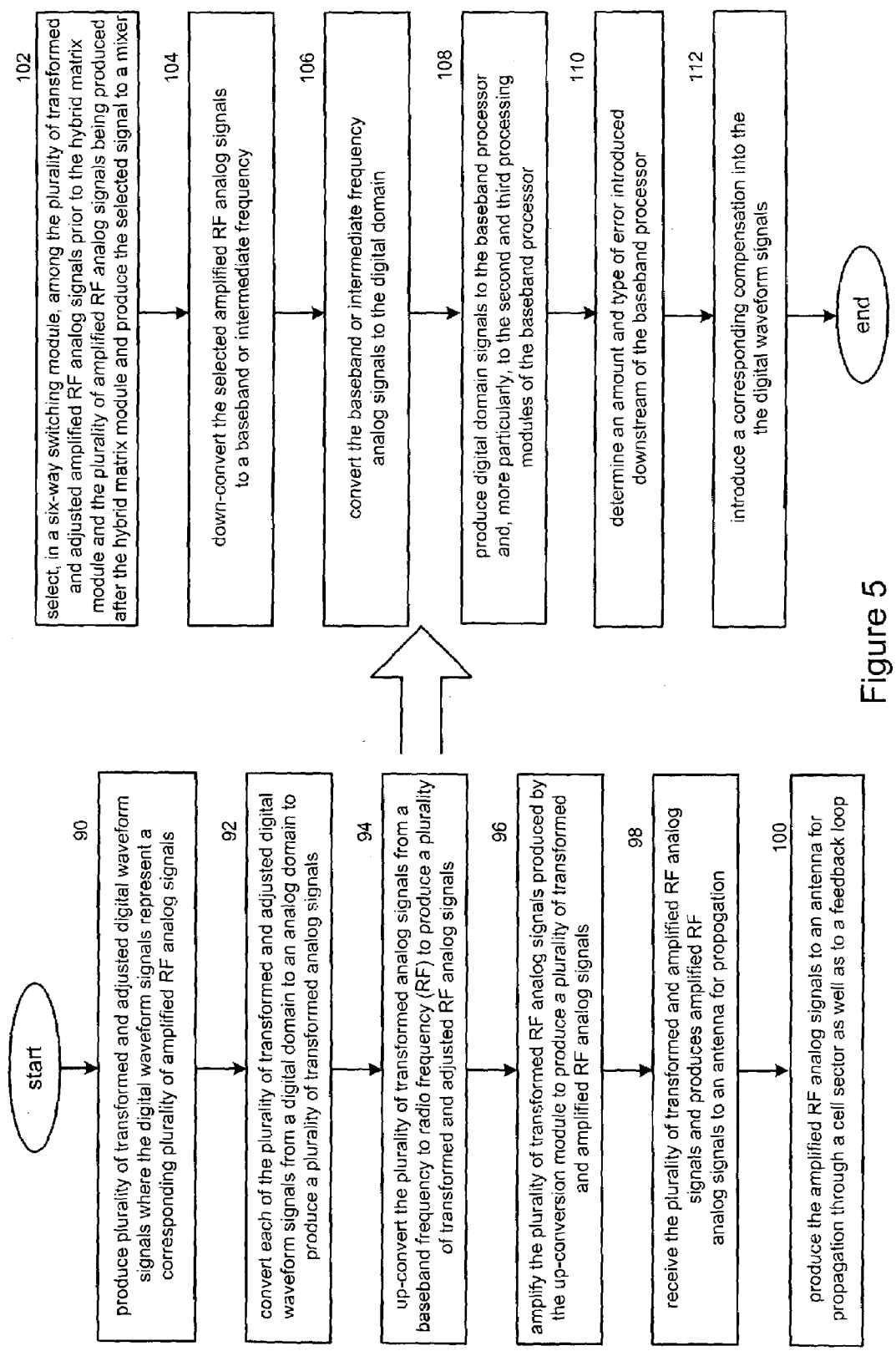
FIG. 5 is a flow chart illustrating a method for generating forward link communication signals according to an embodiment of the invention.

FIG. 5 is a flowchart illustrating a method by a base station for generating forward link communication signals according to an embodiment of the invention. Initially, a baseband processor produces a plurality of transformed and adjusted digital waveform signals where the digital waveform signals represent a corresponding plurality of amplified RF analog signals (step 90). In general, the radio transmitter transmits an amplified RF analog signal to mobile terminals within a cell or cell sector. Because the baseband processor operates in the digital domain, however, it generates a plurality of transformed and adjusted digital waveform signals where the digital waveform signals represent a corresponding plurality of amplified RF analog signals that are to be transmitted from antennas within the corresponding cell sectors.

Thereafter, a digital-to-analog conversion module in the radio transmitter converts each of the plurality of transformed and adjusted digital waveform signals from a digital domain to an analog domain to produce a plurality of transformed analog signals (step 92). The transformed analog signals are then up-converted from a baseband frequency to radio frequency (RF) to produce a plurality of transformed RF analog signals (step 94). The radio transmitter then amplifies the plurality of transformed RF analog signals produced by the up-conversion module to produce a plurality of transformed amplified RF analog signals (step 96).

The hybrid matrix module is coupled to receive the plurality of transformed amplified RF analog signals and produces amplified RF analog signals to an antenna for propagation (step 98). Each of the amplified RF analog signals only includes components for the amplified RF analog signal for transmission into a specific cell sector. The transmitter produces the amplified RF analog signals to an antenna for propagation through a cell sector as well as to a feedback loop (step 100). In addition to propagating the amplified RF analog signals, the feedback loop(s) need to be utilized to provide the baseband processor the ability to determine what downstream error has been introduced to facilitate compensation therefore. Accordingly, the invention includes selecting, in a six-way switching module in one embodiment of the invention, among the plurality of transformed and amplified RF analog signals prior to the hybrid matrix module and the plurality of amplified RF analog signals being produced after the hybrid matrix module and produce the selected signal to a mixer for down-conversion from RF to baseband or an intermediate frequency (step 102).

Thereafter, the amplified RF analog signals are converted to a baseband or intermediate frequency in the described embodiment of the invention (step 104). The method then includes conversion of the baseband or intermediate frequency analog signals to the digital domain (step 106). The digital domain signals are then produced to the baseband processor and, more particularly, to the second and third processing modules of the baseband processor (step 108). The baseband processor or, more particularly, the second processing module of the baseband processor, then determines an amount and type of error introduced downstream of the baseband processor (step 110). Finally, the invention includes introducing a corresponding compensation into the digital waveform signals to compensate for the determined error introduced downstream from the baseband processor (step 112).

The invention disclosed herein is susceptible to various modifications and alternative forms. Specific embodiments therefore have been shown by way of example in the drawings and detailed description. It should be understood that the drawings and detailed description thereto are not intended to limit the invention to the particular form disclosed, but on the contrary, the invention is to cover all modifications, equivalents and alternatives falling within the spirit and scope of the present invention as defined by the claims. For example, while the described embodiment of the invention has been discussed in terms of a 3 by 3 hybrid matrix, the invention specifically includes a matrix of any size (N×N).

What is claimed is:

1. A radio transmitter, comprising:
   a baseband processor for processing digital signals transmitted and received over a wireless communication link, which baseband processor produces a plurality of digital waveform signals each representing a corresponding plurality of analog signals, wherein the baseband processor includes:
   a first processing module for generating the plurality of digital waveform signals, wherein each of the plurality of digital waveform signals represents a corresponding analog signal that is to be transmitted within corresponding cell sectors of a cellular network cell;
   a second processing module coupled to receive and transfer the plurality of digital waveform signals to produce a corresponding plurality of transformed digital waveform signals, each containing components of each of the plurality of digital waveform signals; and
   a third processing module coupled to receive and adjust the transformed digital waveform signals to compensate for distortion and to adjust peak power to produce a plurality of transformed and adjusted digital waveform signals;
   a digital-to-analog conversion module coupled to receive the plurality of transformed and adjusted digital waveform signals, the digital-to-analog conversion module for converting the plurality of transformed and adjusted digital waveform signals from a digital domain to an analog domain, the digital-to-analog conversion module for producing a plurality of transformed analog signals;
   an up-conversion module for mixing a local oscillation signal with each of the plurality of transformed analog signals to up-convert each of the plurality of transformed analog signals from a baseband frequency to a radio frequency to produce a plurality of transformed and adjusted RF analog signals;

at least one power amplifier module coupled to receive the plurality of transformed and adjusted RF analog signals to produce a plurality of transformed and amplified RF analog signals wherein the plurality of transformed and amplified RF analog signals each contain analog components of each of the plurality of analog signals;

a hybrid matrix module coupled to receive the plurality of transformed and amplified RF analog signals, the hybrid matrix module for separating analog components of the plurality of analog signals found in each of the plurality of transformed and amplified RF analog signals to create a plurality of amplified RF analog signals; and feedback circuitry coupled to receive the plurality of amplified RF analog signals, the feedback circuitry including an analog-to-digital conversion module, the feedback circuitry for producing digital waveform signals to the second processing module of the baseband processor.

2. The radio transmitter of claim 1 wherein the second processing module detects at least one vector and delay error in an output signal.

3. The radio transmitter of claim 2 wherein the second processing module compensates for at least one vector and delay error in an output signal.

4. The radio transmitter of claim 1 wherein the digital waveform signals comprises three digital waveform signals that represent three corresponding analog signals.

5. The radio transmitter of claim 4 wherein the hybrid matrix module comprises a hybrid matrix, which hybrid matrix includes at least three inputs for receiving the plurality of transformed and amplified RF analog signals with components of the plurality of analog signals, the hybrid matrix further including at least three outputs for producing the plurality of amplified RF analog signals.

6. The radio transmitter of claim 1 wherein the feedback circuitry includes a plurality of directional couplers, each directional coupler of the plurality of directional couplers attached to each output of the hybrid matrix module wherein the outputs of the hybrid matrix module are propagated from an antenna and are also conducted back to the baseband processor in a feedback loop.

7. The radio transmitter of claim 6 further comprising a six-way switch for selectively coupling signals back into the baseband processor by way of an analog-to-digital converter, which six-way switch is coupled to receive each of the plurality of amplified RF analog signals.

* * * * *